United States Patent [19]

Imai et al.

[11] Patent Number: 5,488,923

[45] Date of Patent: Feb. 6, 1996

[54] METHOD FOR PRODUCING SINGLE CRYSTAL

[75] Inventors: Masato Imai, Hiratsuka; Hiroyuki Noda, Yamagata; Yutaka Shiraishi, Hiratsuka; Keishi Niikura, Hiratsuka; Shoei Kurosaka, Hiratsuka, all of Japan

[73] Assignee: Komatsu Electronic Metals Co., Ltd., Kanagawa, Japan

[21] Appl. No.: 399,558

[22] Filed: Mar. 7, 1995

Related U.S. Application Data

[62] Division of Ser. No. 39,206, Apr. 6, 1993, Pat. No. 5,427,056.

[30] Foreign Application Priority Data

Oct. 17, 1990 [JP] Japan ............................... 278424

[51] Int. Cl.⁶ ................................................ C30B 15/04
[52] U.S. Cl. ........................................ 117/33; 117/18
[58] Field of Search ................................ 117/13, 18, 31, 117/33, 53, 213

[56] References Cited

U.S. PATENT DOCUMENTS

| | | | |
|---|---|---|---|
| 3,206,286 | 9/1965 | Bennett, Jr. et al. | 117/202 |
| 3,459,335 | 8/1969 | Cohen et al. | 222/146.2 |
| 4,036,595 | 7/1977 | Lorenzini et al. | 117/202 |
| 4,168,942 | 9/1979 | Firth | 425/144 |
| 4,282,184 | 8/1981 | Fiegl et al. | 117/202 |
| 4,366,024 | 12/1982 | Ast et al. | 117/17 |
| 4,454,096 | 6/1984 | Lorenzini et al. | 117/213 |
| 4,973,454 | 11/1990 | Morioka et al. | 117/213 |
| 5,242,531 | 9/1993 | Klingshirn et al. | 117/21 |

FOREIGN PATENT DOCUMENTS

| | | |
|---|---|---|
| 61-158897 | 7/1961 | Japan . |
| 60-137891 | 7/1965 | Japan . |
| 59-156993 | 9/1984 | Japan . |
| 1286987 | 11/1989 | Japan . |

Primary Examiner—R. Bruce Breneman
Assistant Examiner—Felisa Garrett
Attorney, Agent, or Firm—Welsh & Katz, Ltd.

[57] ABSTRACT

The present invention employs the construction wherein a resistor heater is disposed inside a protective cylinder whose tip is open to a molten liquid packing zone of a crucible inside a pulling apparatus so that the resistor heater is above the tip of a lower portion and temperature setting can be made so as to be capable of fusing a starting material. Since the tip of the protective cylinder is positioned inside the molten liquid at the time of pulling of a single crystal, the gaseous phase portion inside the protective cylinder and the gaseous phase portion inside the pulling apparatus are separated apart by the molten liquid and are independent of each other and a starting material polycrystal rod loaded into the protective cylinder can be supplied to the molten liquid surface inside the crucible while being molten at the lower part of the protective cylinder by the resistor heater. In this manner, the single crystal whose impurity concentration is substantially uniform in the longitudinal direction can be grown continuously.

2 Claims, 14 Drawing Sheets

METHOD FOR PRODUCING SINGLE CRYSTAL

This is a division, of application Ser. No. 08/039,206, filed May 6, 1993 now U.S. Pat. No. 5,427,056.

FIELD OF USE OF THE INVENTION

The present invention relates to techniques for continuously feeding a material into a crucible to continuously producing a uniform semiconductor single crystal.

BACKGROUND ART

A CZ (Czochralski) process is used which grows a pillar-shaped crystal from a molten material liquid in a crucible in order to grow a semiconductor single crystal. Usually, in the growth of a semiconductor single crystal, a method of controlling the resistivity of a single crystal to be grown is used. In the CZ process, impurity elements called dopants are added into the molten liquid in the crucible in order to control the resistivity of the grown single crystal. Since, however, the dopants generally have a segregation coefficient not equal to 1, the concentration of the dopants in the crystal changes as the length of the crystal increases in an ordinary CZ process. This is a problem in producing semiconductor single crystals where the resistivity of the crystals is controlled in accordance with the concentration of the dopants.

In order to solve this problem, a continuous charging method or a technique using a double crucible has been proposed where the starting material is continuously fed into a crucible and the concentration of dopants in the molten material liquid is kept constant (published unexamined Japanese patent application 63-79790). As a starting material feeding device used in the continuous charging method, there has been a proposal in which a place for melting the starting material is separated from a place for growing a single crystal to which the molten material is transported (Published unexamined Japanese patent applications Sho 52-58080 and 56-164097). Another proposal is the use of a rod-shaped starting material (published unexamined Japanese patent applications Sho 56-86397 and 62-105992).

The former two continuous charging techniques (that is, described in the applications Sho 52-58080 and 56-164097) require two crucibles, one is for melting the starting material and the other is for growing a crystal. As a result, device structure becomes complicated. In addition, the feeding of the material is difficult to control. The latter two techniques (that is, described in the applications Sho 56-86397 and 62-105992) require a large temperature gradient in each of the crystal growth place and material melting place in the crucible in order to melt the starting material rod with the molten material liquid in the crucible. However, it is very difficult to provide a temperature gradient for melting the starting material during the crystal growth. In addition, the technique described in the application Sho 62-105992 uses a high frequency power to preheat the starting material, which is not practical because, for example, an electric discharge may occur with high probability in a reduced pressure furnace used in the growth of single crystal silicon. In the double crucible technique, since the inner crucible used for the growth of the crystals maintains the molten state of the starting material by the heat radiated from the outer crucible, the heat cannot sufficiently be transmitted from the heater. As a result, a polycrystal is likely to be produced from the inner wall of the inner crucible, resulting in the decrease in the growth rate. In addition, there is another problem that a large quantity of impurities may enter from the crucible material into the starting material.

DISCLOSURE OF THE INVENTION

It is an object of the present invention to provide a semiconductor single crystal producing apparatus and method capable of solving the problems with the conventional continuous charging techniques and capable of producing a single crystal whose impurity concentration is substantially uniform over the longitudinal direction thereof.

In the inventive semiconductor single crystal producing apparatus, a resistor heater is provided in a protective cylinder. The cylinder is open at a fore end to molten material liquid area in a crucible within a pulling unit. The heater is positioned above an end of the protective cylinder to provide sufficient temperature to melt the starting material. When the single crystal is pulled, the lower end of the protective cylinder is positioned in the molten material liquid. Thus, a gaseous phase portion in the protective cylinder, i.e., in the starting material feeding mechanism is separated from the gaseous phase portion in the pulling unit by the molten material liquid. A polycrystalline material rod loaded in the protective cylinder is melted by the resistor heater at a lower portion of the protective cylinder and is fed to the surface of the molten liquid in the crucible.

Preferably, the resistor heater is constructed so that its temperature is higher at its lower portion.

Preferably, an isolating member is disposed between the gaseous phase portion in the starting material feeding mechanism and the gaseous phase portion in the pulling unit to completely separate therebetween and to evacuate both the gaseous phase portions independently of each other.

Preferably, the gaseous phase portion in the starting material feeding mechanism has the degree of vacuum equal to or higher than that of the gaseous phase portion in the pulling unit.

The inventive method is characterized in that new starting material is melted and fed by the starting material feeding mechanism whose gaseous phase portion is independently provided from the gaseous phase portion in the device, thereby pulling up a single crystal continuously.

With the above construction, according to the present invention, even if the molten liquid in the crucible starts to decrease when the pulling is started, starting material can be continuously fed by adjusting the feeding rate of the starting material rod so as to compensate for a decrease in the melted material and by controlling power applied to the resistor heater to melt the material rod. Further, since the tip of the protective cylinder is placed within the molten liquid in the crucible, the molten material falls on the surface of the melted material liquid in the protective cylinder. Thus, a falling foreign matter, if any, would stay within the protective cylinder whereby a single crystal of high purity is produced.

An isolating member is provided between the crucible and an opening in the other end of the starting material feeding mechanism to isolate the gaseous phase portion of the molten material liquid in the crucible and the opening in the other end of the starting material feeding mechanism to thereby isolate the crystal pulling unit and the material feeding mechanism completely through the isolating member. Therefore, the molten material falls on the surface of the molten liquid in the crucible. Foreign matters, if any, would stay within the protective cylinder and those gaseous phases are completely separated from each other, so that mixing of impurities with the crystal material is completely avoided. Thus, a stable crystal can be grown continuously.

As described above, the gaseous phase portion in the starting material feeding mechanism has the degree of vacuum equal to or a higher than that of the gaseous phase portion in the pulling unit. Thus, even if there is any gas mixing from the gaseous phase portion in the pulling unit into the gaseous phase portion in the starting material feeding mechanism, there is no gas mixing in the reverse direction. Therefore, a semiconductor single crystal of higher reliability can be produced.

Further, since the resistor heater is constructed such that its temperature is higher at its lower portion to heat the starting material rod gradually toward the higher temperature, melting takes place only at the lower portion of the rod. Thus, feeding of the material rod is controlled satisfactorily.

Preferable, by employing the resistor heater in the form of cylindrical spiral resistor, molten portion of the material can be placed near the surface of the molten liquid. Thus, the device can be compact.

Preferable, by making the diameters of the protective cylinder and the resistor heater smaller toward the downward direction, it becomes easy to control the feeding of the material.

By flowing an inert gas of 50 cc/min.cm$^2$ or more through the starting material feeding mechanism, stagnation of a carbon monoxide in the starting material feeding mechanism can be prevented to prolong the service life of the heater.

Since the present invention employs the structure in which the resistor heater melts a rod-shaped starting material directly above the surface of the molten material liquid, an electric discharge is prevented. The starting material rod has the same concentration of dopant as in the grown single crystal. The feeding rate or feeding weight of the material is controlled, for example, on the basis of the pulling rate or pulling weight of the single crystal and, when required, by adjusting the electric power supplied to the resistor heater. Thus, starting material corresponding to the quantity of the pulled crystal can be fed into the molten liquid in the crucible.

In addition, provision of a gas feeding tube and a discharge tube through which the gas is discharged to the outside permits feeding of an inert gas into the protective cylinder, and prevents stagnation of silicon monoxide in the cylinder to thereby prolong the service life of the heater.

BEST MODE FOR CARRYING OUT THE INVENTION

Embodiments of the present invention will be described below in detail with reference to the accompanying drawings.

EMBODIMENT 1

Figure 1:
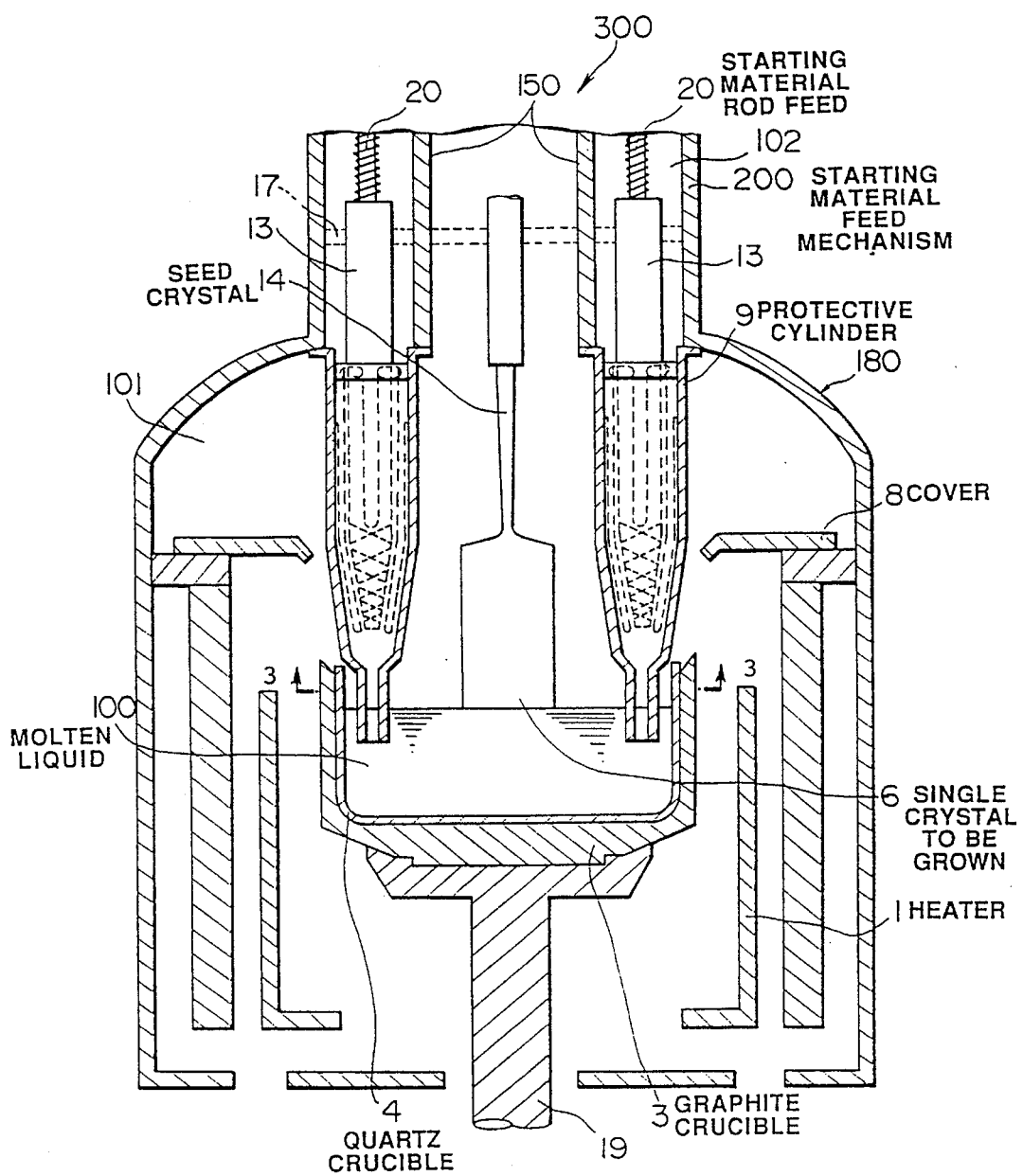
FIG. 1 is a longitudinal cross-section view of a single crystal producing device according to the first embodiment of the present invention.
Figure 2:
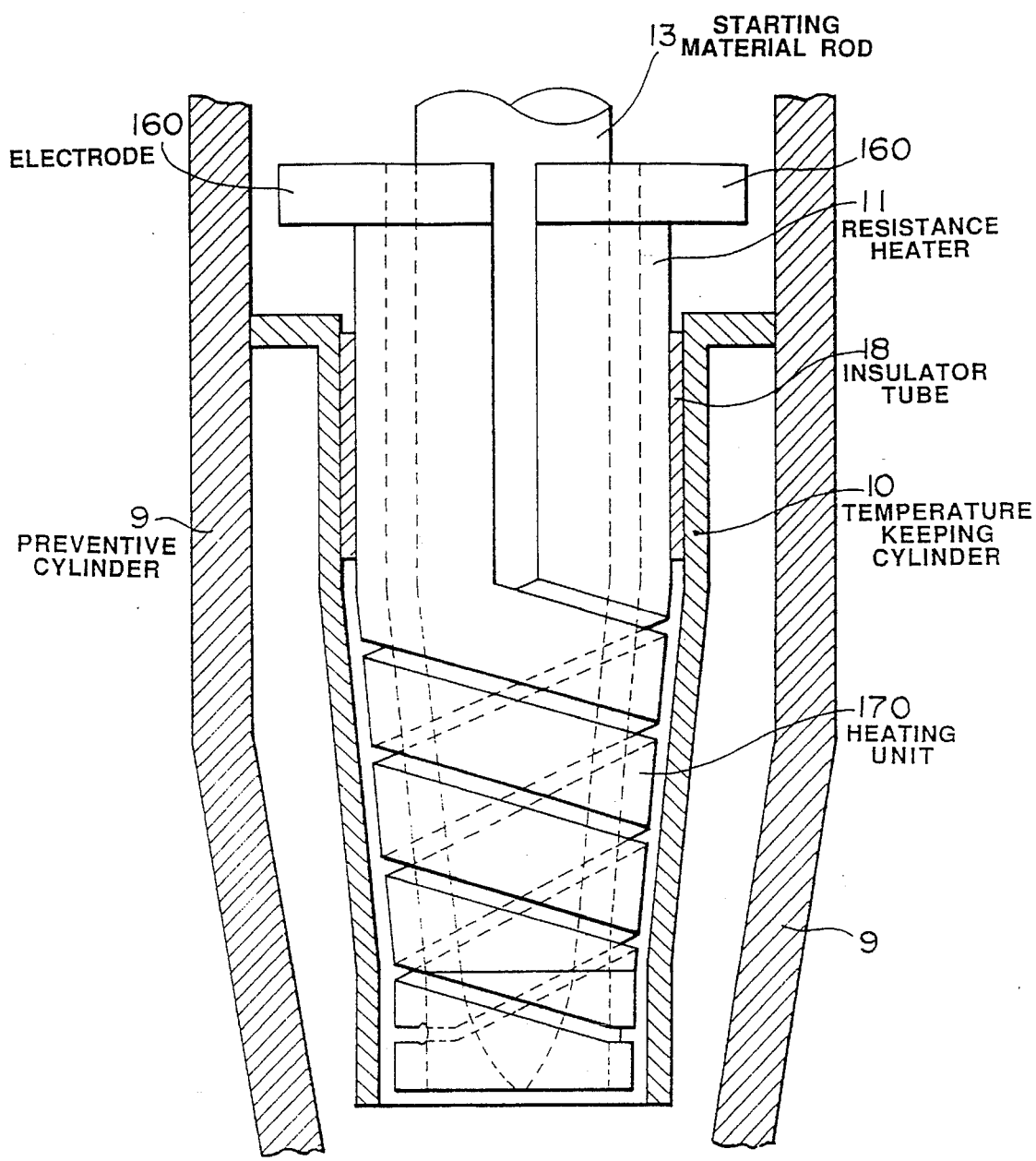
FIG. 2 is a longitudinal cross-section view of a resistor heater.
Figure 3:
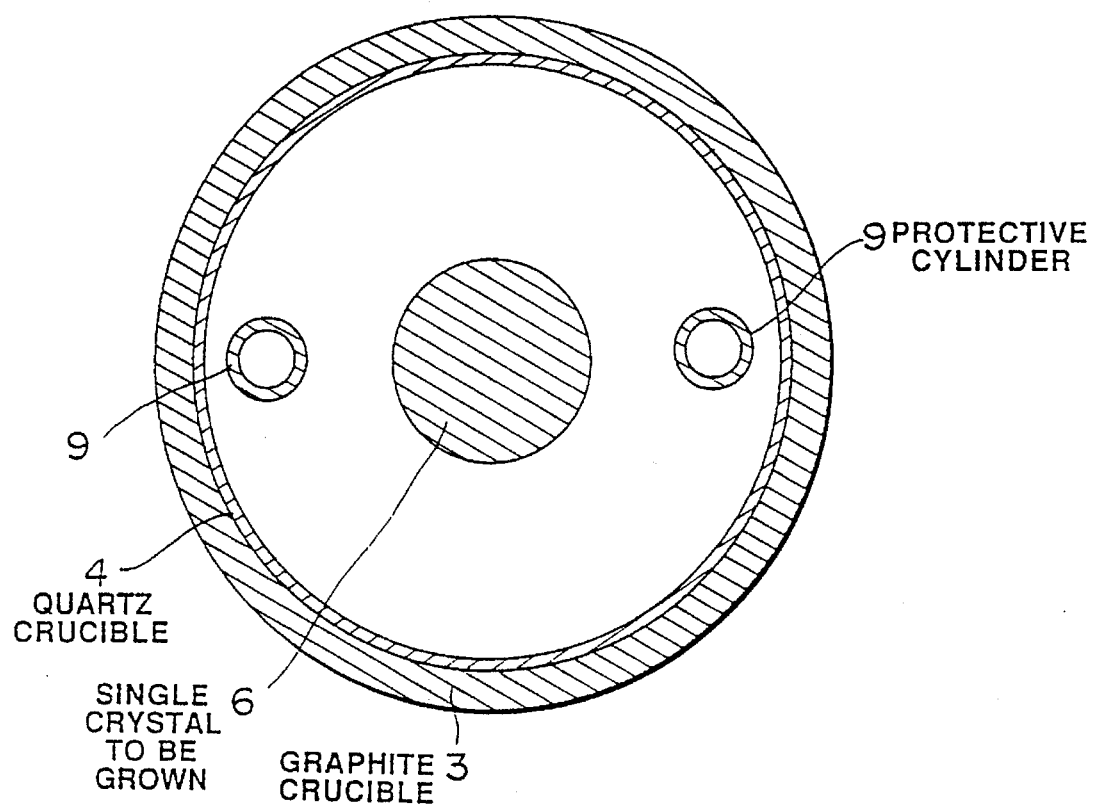
FIG. 3 is a transverse cross-section view taken along the line A—A of FIG. 1.

Referring to FIGS. 1–3, a single crystal growing device as a first embodiment of the present invention is composed of a single crystal producing device body 180, a molten material liquid 100, a starting material feeding mechanism 200 and a pulling unit 300. A pair of protective cylinders 9 each having a lower cylindrical end made of quartz covers an overall resistor heater with its tip being immersed in the molten material liquid such that a gaseous phase portion 102 in the material feeding mechanism 200 is isolated from a gaseous phase portion 101 in the pulling unit 300. The material feeding mechanism 200 feeds the starting material to the molten material liquid 100 while the crystal is being continuously pulled.

As shown in FIG. 2, the material feeding mechanism 200 is composed of a resistor heater 11, a temperature keeping cylinder 10 which covers the heater 11 therearound, a protective cylinder 9 which covers the temperature keeping cylinder 10 therearound, a hold tube 150 which supports the cylinder 9 therearound, and a starting material rod feeding unit 20 which feeds a rod-shaped polycrystal as a starting material rod into the heater 11. In order to minimize the thermal influence of the heater 11 on a single crystal to be grown, the heater 11 is held at its upper end portion through an insulator tube 18 by the temperature keeping cylinder 10, which is accommodated in the protective cylinder 9. That is, the heater 11, insulator tube 18, and cylinder 10 are held within the protective cylinder 9. As shown in FIG. 1, the protective cylinder 9 is fixed airtightly at its upper end to the hold tube 150 provided in the single crystal producing device body 180 with the tip of the cylinder 9 being positioned in a portion in the crucible into which the molten material liquid is fed. Thus, while a single crystal is grown, the tip of the protective cylinder 9 is normally in the molten material liquid 100. Thus, the gaseous phase portion 102 in the starting material feeding mechanism and the gaseous phase portion 101 in the single crystal producing device are independent of each other. Positioning of the tip of the protective cylinder in the molten material liquid 100 prevents uneven distribution of the temperature and/or surface vibrations of the molten liquid 100 in the crucible even if droplets fall due to the melting of the material rod 13, and arrival of the surface vibrations and falling foreign matters at the growing crystal 6.

The heater 11 takes the form of a split cylinder separated right and left, and has a cylindrical double-spiral heating unit 170 which has upper ends as electrodes 160. The weight of a grown single crystal 6 is sensed by a weight sensor (not shown) such that the quantity of the molten liquid 100 is kept constant to adjust a fed quantity of the starting material rod feed 20 in accordance with a change in the sensed value of the crystal weight. Thus, the material rod 13 is fed into the heater 11; melted in the lower portion of the heating unit 170; and fed into the molten material liquid 100.

As shown in FIG. 1, provision of the material feeding mechanisms at two or more positions except in the single crystal pulling region allows one starting material rod charged previously to be fed when the other starting material rod is consumed, during which a gate valve 17 may be closed to exchange the consumed starting material rod with a new one. Iteration of this work serves to grow a semiconductor single crystal continuously.

In the molten liquid 100, the heater 1 contains a graphite crucible 3 supported by a pedestal 19 with the crucible 3 supporting a quartz crucible 4 which melts the starting material and holds the molten liquid as such.

By the pulling unit 300, a seed crystal 14 is immersed in the molten material liquid and then pulled at a predetermined rate to grow a single crystal 6.

A method of growing a silicon single crystal using the single crystal producing device of FIG. 1 will be described below.

First, the heater 1 is turned on to heat the quartz crucible 3 to obtain a molten material liquid, and the resistor heater 11 is also turned on so as to provide a predetermined temperature profile. A starting polycrystalline silicon rod (having the same concentration of impurities as the pulled single crystal) 13 is fed as a starting material rod by the material rod feed 20 at a predetermined rate into the resistor heater 11.

A seed crystal is immersed into the molten material liquid and pulled at the predetermined rate by the pulling unit 300 to grow the single crystal 6.

Figure 4:
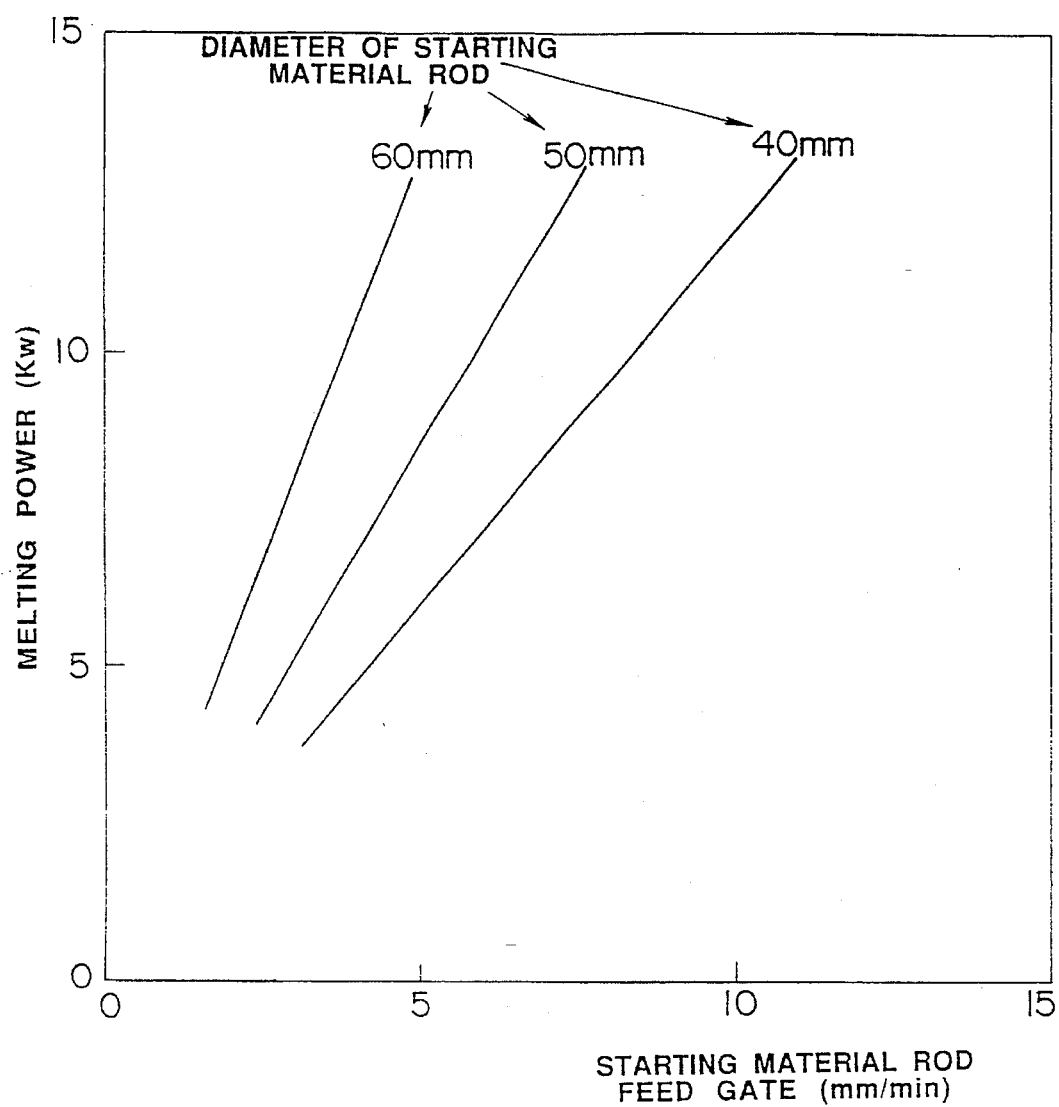
FIG. 4 shows the relationship between starting material feeding rate and melting electrical power with respect to starting material diameter.

The conditions for growing the single crystal were that the quartz crucible 4 had a diameter of 16 inches; the crucible 3 had a molten material liquid of 15 kg; the material rod 13 had a diameter of 50 mm; the grown single crystal 6 had a diameter of 4 inches; the crystal resistivity (doped with phosphorus) was 10 cm; the pulling rate was 1 mm/min. The relationship between the feeding rate of the material rod and the power of the resistor heater, shown in FIG. 4, was maintained. The feeding rate of the material rod 13 was 4 mm/min. and the power of the resistor heater 11 was 6 kW. The relationship between a change in the weight of the pulled single crystal and the feeding rate of the material rod was measured and a constant feeding rate obtained from the result of the measurement was used.

Figure 5:
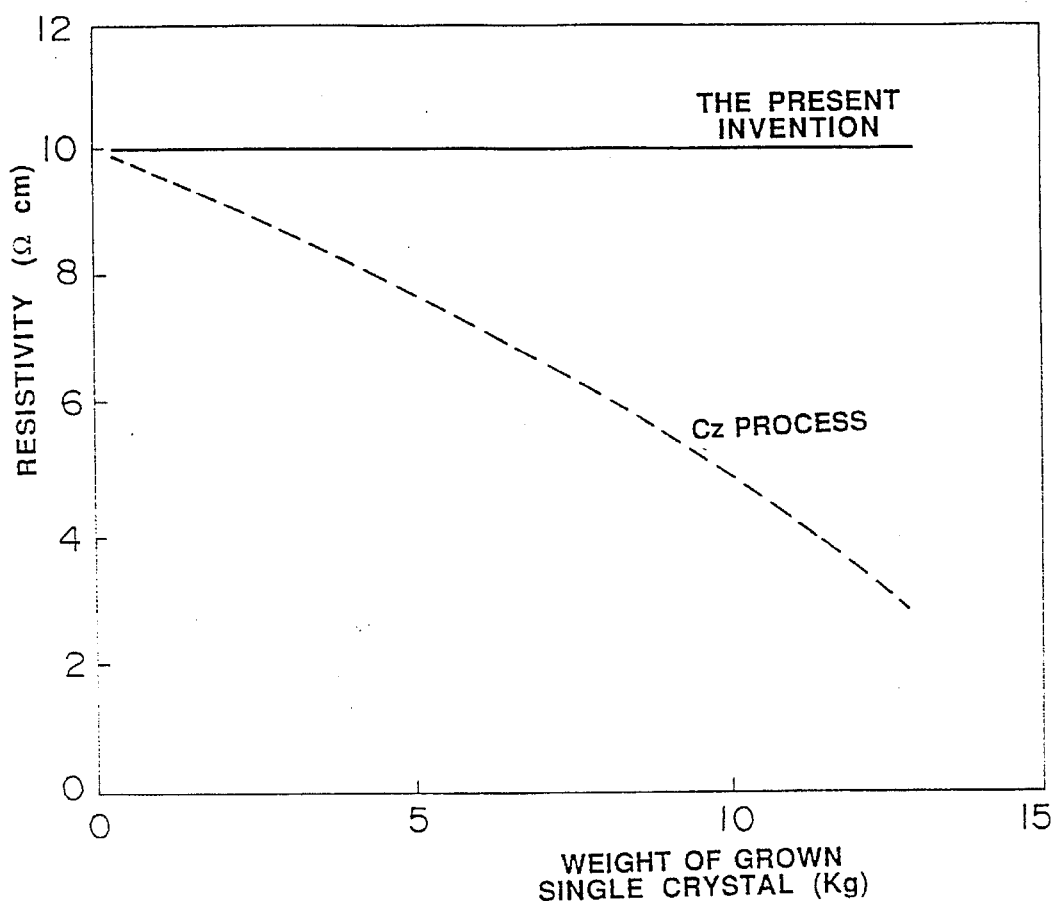
FIG. 5 shows the relationship between weight and resistivity of a grown single crystal in the first embodiment of the present invention.

FIG. 5 shows an axial change in the resistivity of the single crystal thus grown. For reference, it also shows the result of using an ordinary CZ process with the same initial quantity of molten material liquid as that in the inventive method. In the ordinary CZ process, as the crystal grows more, its resistivity changes more greatly while the single crystal grown by the inventive process exhibits a substantially constant resistivity.

Figure 6:
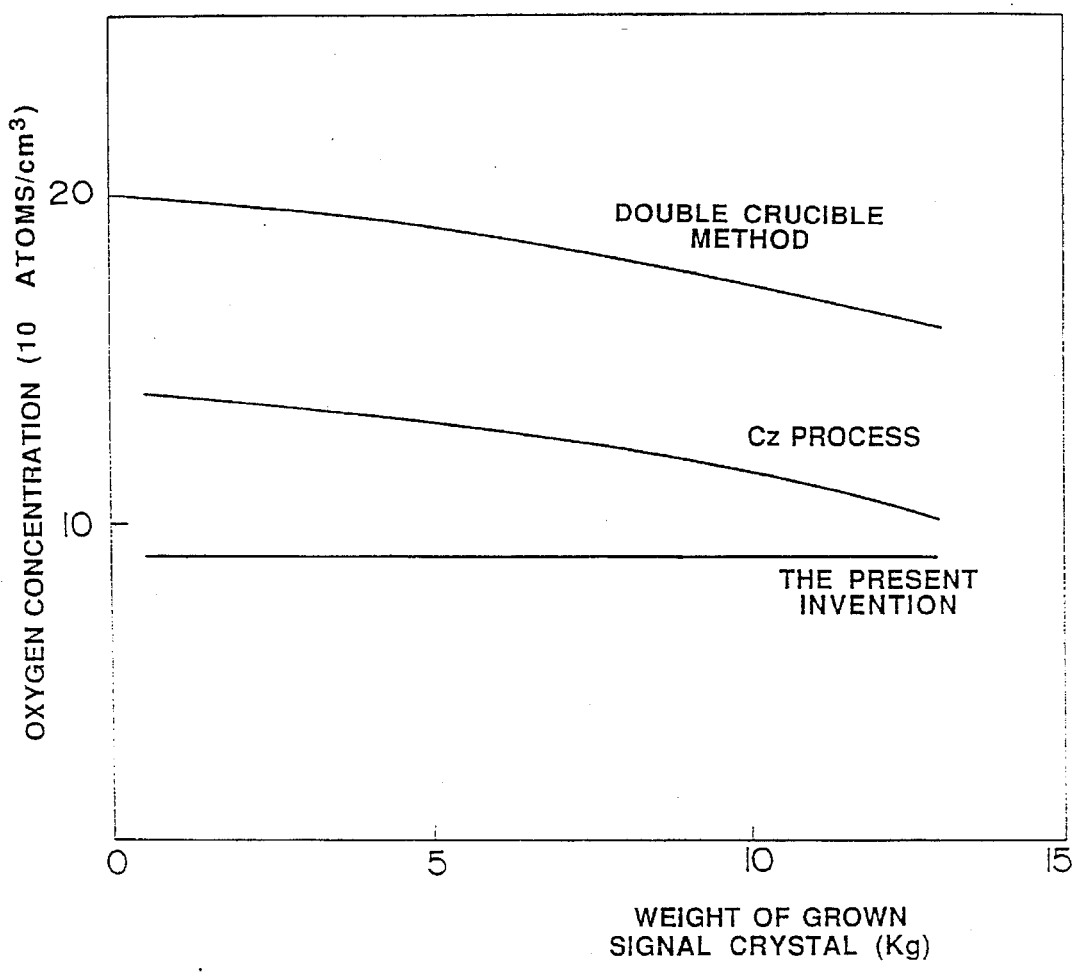
FIG. 6 shows the relationship between weight and oxygen concentration of a grown single crystal in the first embodiment of the present invention.

FIG. 6 shows an axial change in the oxygen concentration. The growth conditions are the same. As will be obvious from FIG. 6, the single crystal grown according to the present invention is uniform in the axial direction, and is low in oxygen concentration compared to the ordinary CZ process and less than half of the oxygen concentration of the crystal obtained by the double-crucible. Thus, the range of oxygen controlled can be extended.

Since the resistor heater is used as a heater for melting the starting material rod, the occurrence of electric discharge in the single crystal producing device is prevented. In addition, since the resistor heater employs a double-spiral structure, the device is compact, and the lower end of the heater can be set at the highest temperature. Thus, the molten portion of the material can be accessed to the surface of the molten material liquid, the material can be melted immediately above the molten material liquid and ingress of impurities into the molten material is greatly reduced.

Since the protective cylinder and the resistor heater taper downward, control of a fed quantity of starting material is easily achieved.

Since the protective cylinder is provided within the pulling unit except in a region where a single crystal is grown, it will not hinder the pulling operation.

In the present device, in order to completely isolate the gaseous phase portion in the single crystal producing unit and the gaseous phase portion in the starting material feeding mechanism from each other, the protective cylinder which covers the overall resistor heater is employed with the tip of the protective cylinder being positioned in the molten material liquid. Therefore, possible falling foreign matters are prevented from arrival at the crystal growing section and vibrations of the surface of the molten material liquid due to the feeding of the starting material are suppressed. The vibrations themselves stay within the protective cylinder and are not transmitted to an overall surface of the molten material liquid. A quantity of impurities entering from the crucible into the starting material is reduced and high speed growth of the crystal is achieved compared to the double crucible.

In the conventional growing device with a material feeding mechanism, the gaseous phase sections in the single crystal producing device body and in the material feeding mechanism are not independent of each other. Therefore, SiO, etc,. produced in the material feeding mechanism would fall due to the inner pressure in the material feeding mechanism on the surface of the molten material liquid to thereby hinder the formation of a single crystal. In contrast, such a problem is eliminated in the present invention.

The downward tapering of the protective cylinder and resistor heater facilitates control of a fed quantity of the starting material.

Since the protective cylinder is provided within the pulling unit except in the region where a single crystal is grown, it does not hinder the pulling operation.

By the above-described effects, in the present invention, feeding of the starting material which is the largest problem with the continuous charge type semiconductor single crystal producing device is achieved without adversely affecting the crystal under growth. As a result, the concentration of dopants in the molten material liquid in the crucible is controllable and the axial resistivity of the single crystal is maintained constant.

While in the inventive device, quartz or carbon is preferable as the material of the protective cylinder, the tip of the protective cylinder which touches the molten material liquid is preferably made of quartz of high purity. The material of the resistor heater may be that of an ordinary carbon heater. The material of the temperature keeping cylinder maybe carbon or silicon carbide.

While in the embodiment the feeding rate of a starting material rod is illustrated as a predetermined constant one, it may be sequentially adjusted while a change in the weight of the pulled single crystal is being measured.

Alternatively, the level of the surface of the molten material liquid within the crucible 4 may be sensed, for example, by a photosensor, and the fed quantity of starting material may be changed in accordance with a change in the level of the molten material liquid such that the level of the molten material liquid is invariably maintained constant.

While in the embodiment the protective cylinder and the resistor heater are illustrated as tapering downward, the aforementioned effects are achieved even by causing only the resister heater to taper downward. The protective cylinder preferably tapers downward from a standpoint of thermal efficiency.

The present invention is not limited to the present embodiment and is applicable to various applications, for example, the growth of single crystals other than silicon crystals, application of a magnetic field, the use of a granular material, etc.

EXAMPLE 2

Figure 7:
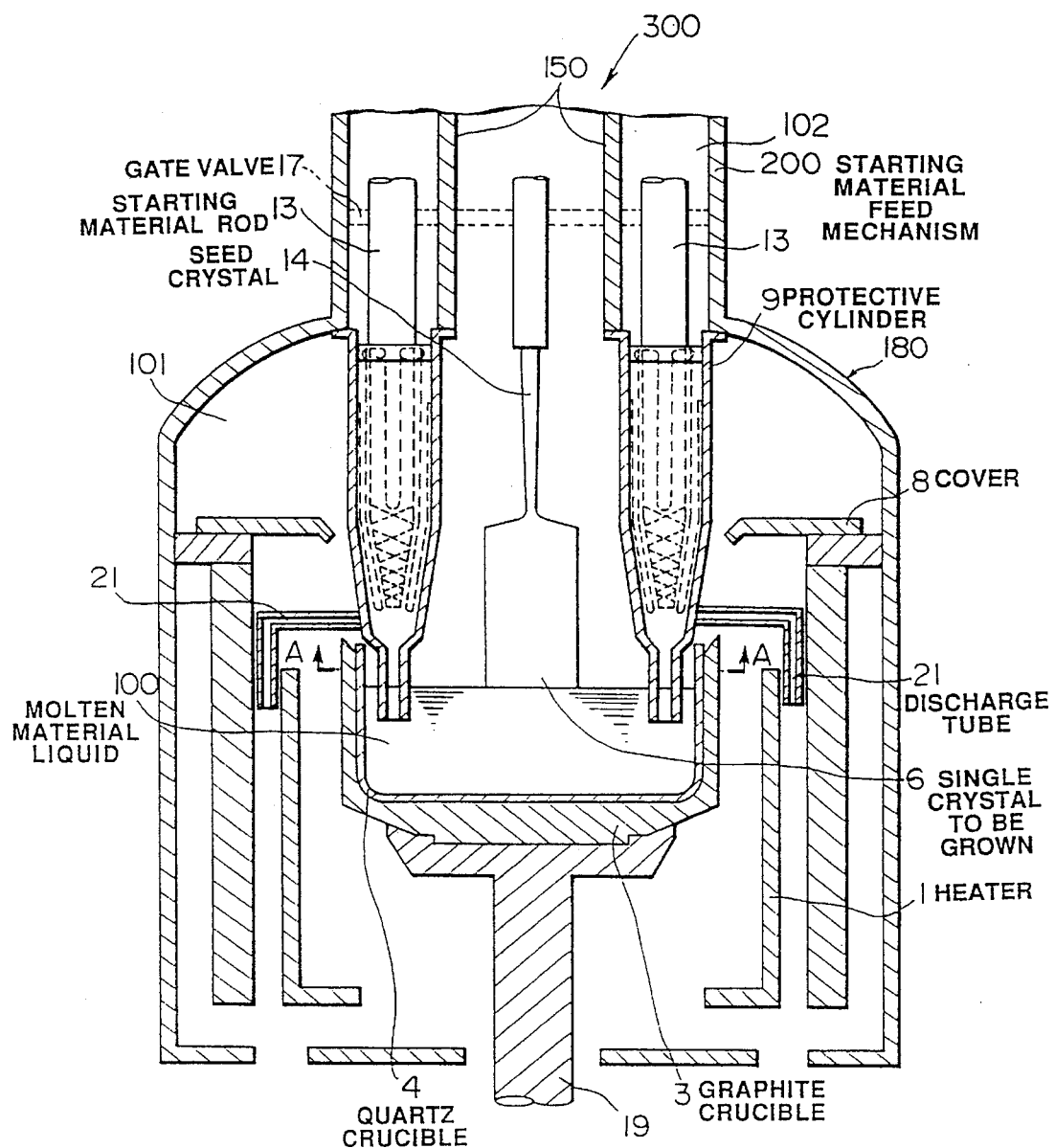
FIG. 7 is a longitudinal cross-section view of a single crystal producing device according to the second embodiment of the present invention.

Referring to FIG. 7, a second embodiment of the present invention will be described below.

The same reference numeral is used to denote the same element in the second and first embodiments and further duplicate description thereof will be omitted.

The second embodiment is mainly different from the first embodiment of FIG. 1 in that an air intake unit (not shown) which feeds air into the material feeding mechanism is provided, and that a discharge tube 21 is provided which extends horizontally from a lower side of each protective cylinder 9 immediately above the molten material liquid 100 and the heater 1 and then bends downward outside the heater 1 such that a gas in the starting material feeding mechanism is discharged to the outside of the heater. Thus, for example, an inert gas can be fed into the gaseous phase portion 102 in the starting material feeding mechanism.

50 cc/min. cm$^2$ of argon gas was fed into the material feeding mechanism 200 while the gas was being discharged from the discharge tube 21, using the above device, to grow a silicon single crystal under the same conditions as those in the first embodiment 1.

While the property of the resulting grown single crystal was similar to that of the first embodiment, no production of silicon carbide such as was produced in the embodiment 1 was recognized at the heater and more particularly at its lower end and it was recognized that this arrangement was effective for prevention of a deterioration in the resistor heater 1. It is considered that this occurs because the flow of argon gas serves to carry away a silicon vapor/a silicon monoxide rising from the surface of the molten material liquid to outside the system before the vapor/silicon monoxide contact the resistor heater.

As just described above, according to the device of the embodiment 2, the discharge tube is provided to the protective cylinder between the lower end of the resistor heater and the surface of the molten material liquid and an inert gas is fed into the starting material feeding mechanism. Therefore, a stagnation of silicon monoxide is prevented and a quantity of silicon carbide deposited on the resistor heater is reduced. This serves to prevent a deterioration in the resistor heater. In this case, a flow of the inert gas is preferably 50 cc/min. cm$^2$ or more in order to carry away a silicon vapor/silicon monoxide smoothly from the surface of the molten material liquid to outside the system.

EMBODIMENT 3

A third embodiment of the present invention will be described next.

Figure 8:
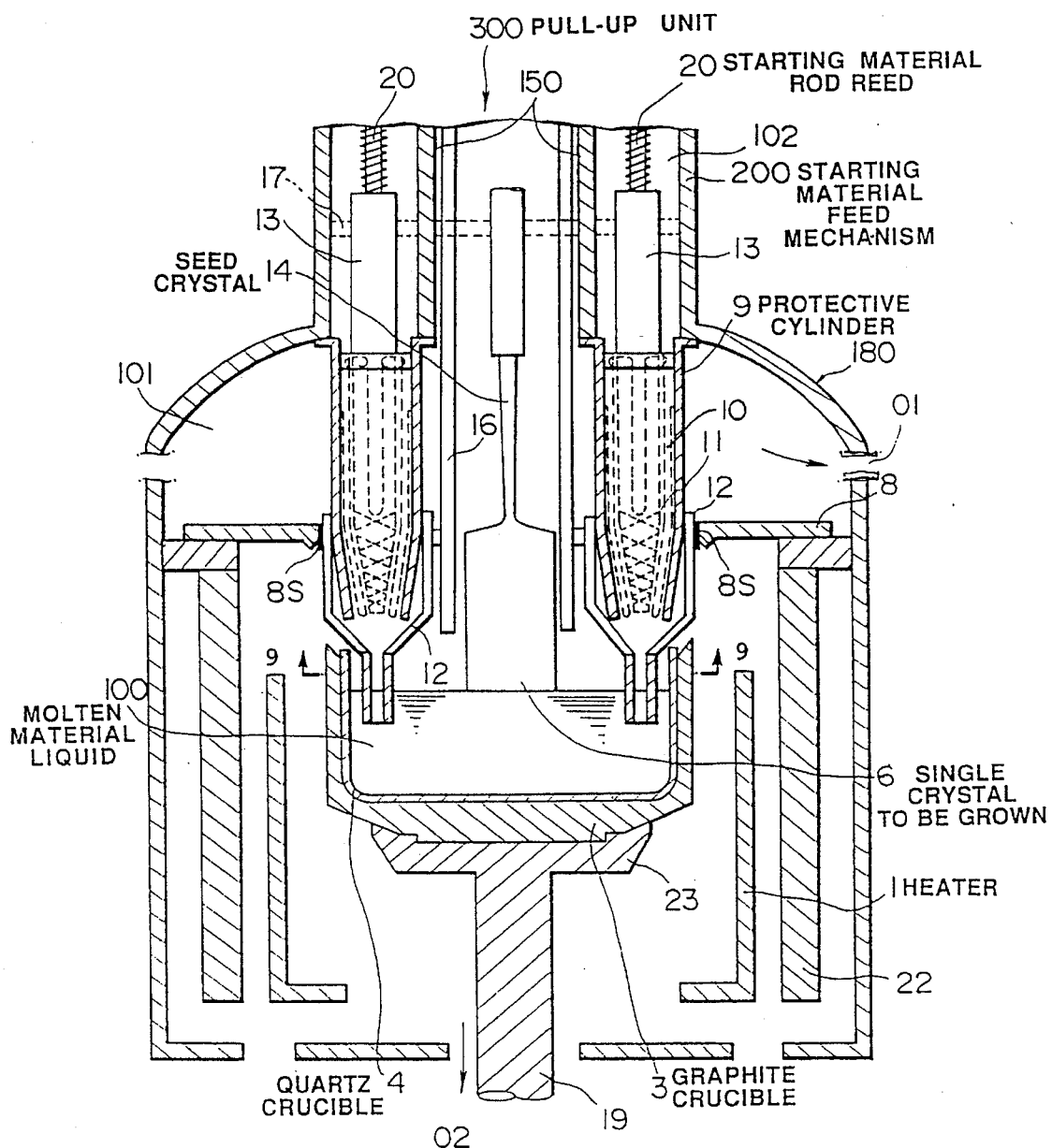
FIG. 8 is a longitudinal cross-section view of a single crystal producing device according to the third embodiment of the present invention.
Figure 9:
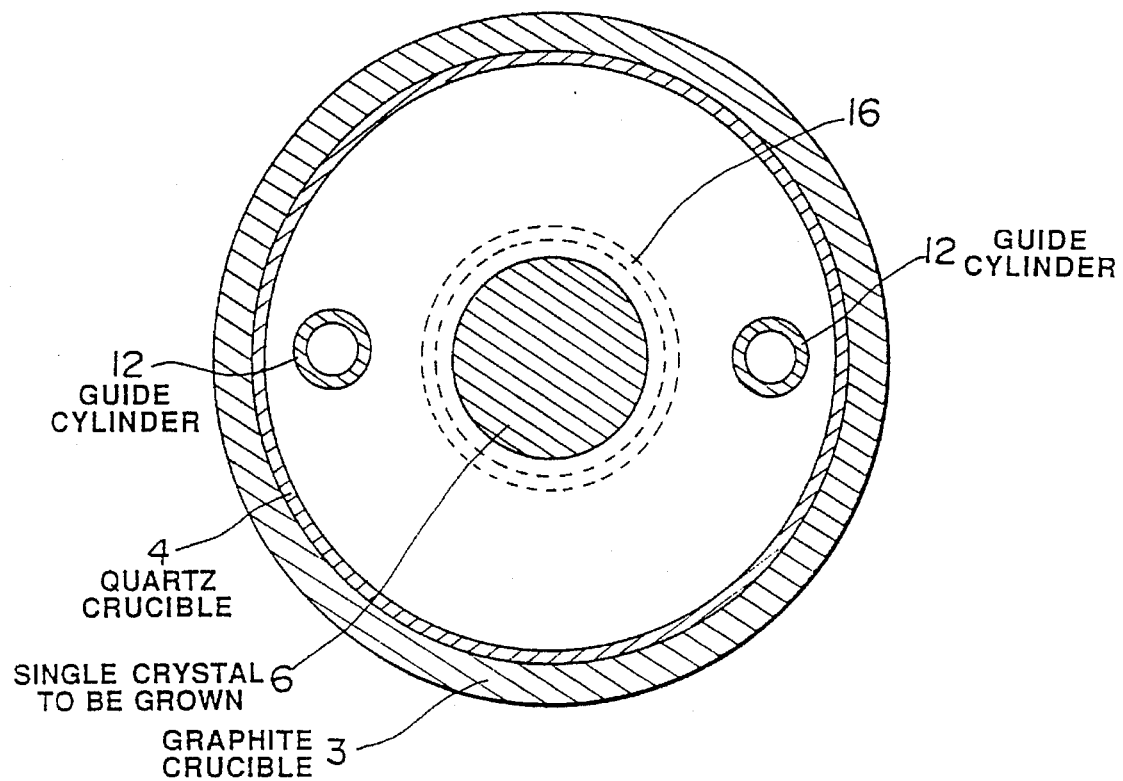
FIG. 9 is a transverse cross-section view taken along the line A—A of FIG. 8.
Figure 10:
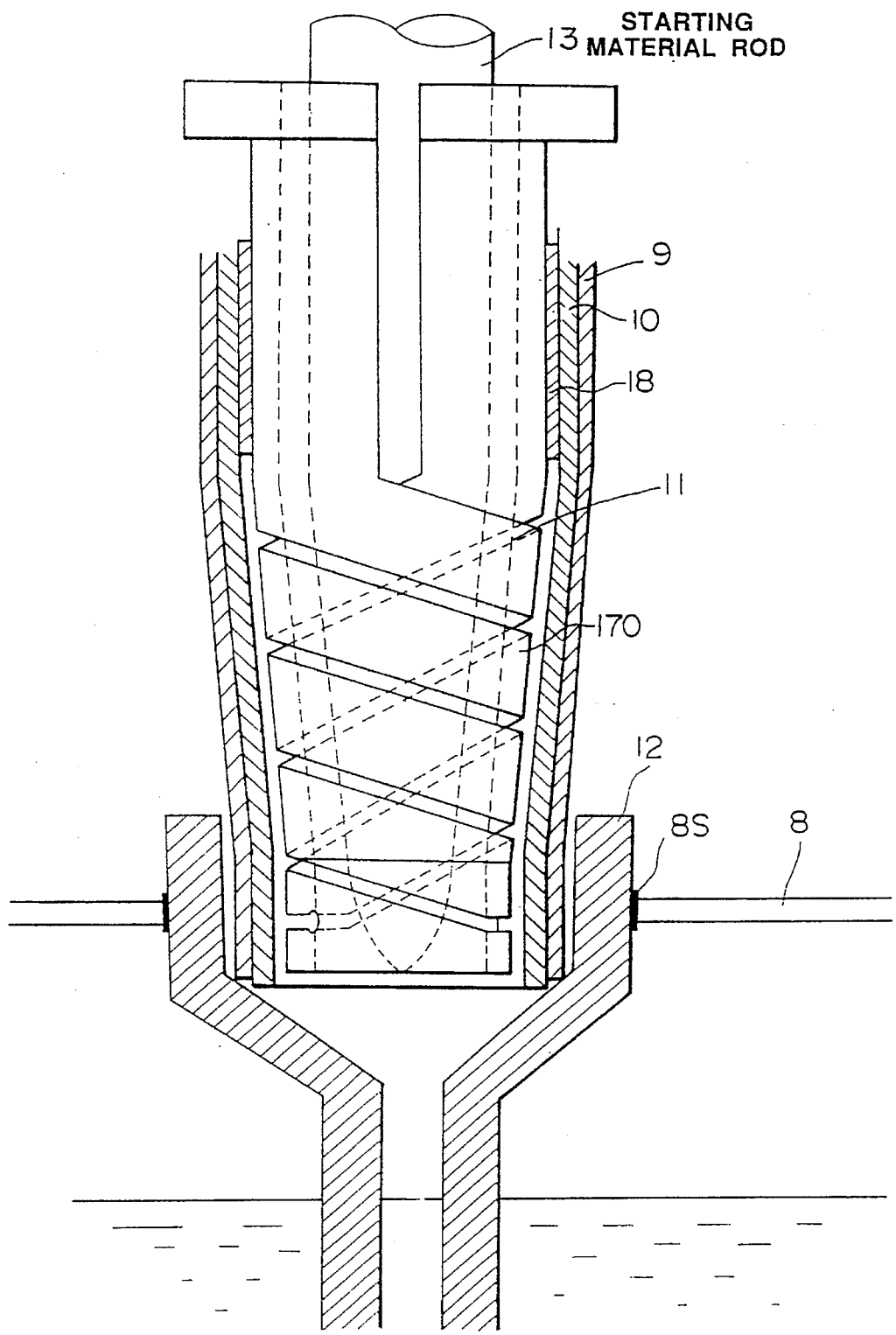
FIG. 10 is a longitudinal cross-section view of a resistor heater.

As shown in FIGS. 8–10 where FIG. 9 is a cross-sectional view taken along the line A—A of FIG. 8, and FIG. 10 shows the essential portion of the starting material feeding mechanism), a single crystal growing device of the third embodiment according to the present invention is composed of a single crystal producing device body 180, a molten material liquid 100 provided within the body 180, a material feeding mechanism 200 and a pulling unit 300. An isolating plate 8 is provided between those elements to isolate the gaseous phase portions in the material feeding mechanism 200 and the pulling unit 300 completely from each other.

The isolating plate 8 is fixed airtightly to the upper end of a thermal insulation shield 22 provided between the molten material liquid 100 and the body 180.

The upper inside space in the single crystal producing device body 180 containing the material feeding mechanism isolated by the isolation plate 8 is evacuated through a first discharge port o1 while the pulling unit and the molten material liquid 100 are evacuated through a second lower discharge port o2 irrespective of the evacuation through the port 01.

Each starting material feeding mechanism 200 is arranged such that a guide cylinder 12 has a downward tapering portion whose tip is inserted in the molten material liquid in the quartz crucible 4 to feed a starting material through the guide cylinder 12.

Provided within each guide cylinder 12 is a resistor heater 11 covered with a temperature keeping cylinder 10, which is, in turn, covered with a protective cylinder 9. A melted material rod is fed to the molten material liquid 100 and continuously pulled. An outer cylinder 16 which surrounds the gaseous phase portion 101 in the pulling unit is inserted airtightly through the isolating plate 8 by means of a seal member 8s. The outer cylinder 16 is made of a material which exhibits high strength at high temperature.

As shown in FIG. 10, the material feeding mechanism 200 is composed of the resistor heater 11, temperature keeping cylinder 10 which covers the heater 11 therearound, protective cylinder 9 which covers the temperature keeping cylinder 10 therearound, hold tube which supports the protective cylinder 9, guide cylinder 12 which is airtightly supported by the isolating plate 8, the guide cylinder 12 being inserted through the resistor heater 11 covered with the protective cylinder 9 and immersed at its tip in the molten material liquid, and starting material rod feeding means 20 which feeds a polycrystalline rod as the material rod into the resistor heater 11 (FIG. 8) such that a molten material liquid produced by melting of the starting material rod falls as droplets into the material liquid. The resistor heater 11 is held at an upper end to the temperature keeping cylinder 10 through the isolating cylinder 18, and the temperature keeping cylinder 10 is accommodated within the temperature keeping cylinder 9 in order to suppress possible thermal influence of the heater 11 on the grown single crystal as much as possible. As shown in FIG. 8, the protective cylinder 9 is fixed airtightly at its upper end to the hold tube 150 provided in the single crystal producing device body 180 with the tip of the cylinder 9 being positioned in a region in the crucible into which the molten material liquid is fed. Thus, while a single crystal is being grown, the tip of the guide cylinder 12 into which the protective cylinder 9 is normally inserted is in the molten material liquid 100 and the upper open end of the guide cylinder is above the isolating plate 8. Thus, the gaseous phase portion 102 in the starting material feeding mechanism and the gaseous phase portion 101 in the single crystal producing device are independent of each other even if a small gap is produced between the protective cylinder and the isolating plate. Positioning of the tip of the protective cylinder in the molten material liquid 100 prevents uneven distribution of the temperature and/or surface vibrations of the molten material liquid 100 in the crucible even if droplets fall due to the melting of the material rod 13, and arrival of the surface vibrations and falling foreign matters at the growing crystal 6.

The heater 11 takes the form of a split cylinder separated right and left, and has a downward tapering double-spiral structured heating unit 170 which has upper ends as electrodes 160. The protective cylinder 9 also tapers downward. The weight of a grown single crystal 6 is sensed by a weight sensor (not shown) such that the quantity of the molten material liquid 100 is kept constant to adjust a fed quantity of the material rod feeding means 20 in accordance with a change in the sensed value. Thus, the material rod 13 is fed into the heater 11; melted in the lower portion of the heating unit 170; and fed into the molten material liquid 100.

As shown in FIG. 8, provision of the material feeding mechanisms at two or more positions except in the single crystal pulling region allows one material rod charged previously to be fed when the other material rod is consumed, during which a gate valve 17 may be closed to exchange the consumed material rod with a new one. Iteration of this work serves to grow a semiconductor single crystal continuously.

In the molten material liquid 100, the heater 1 contains a quartz crucible 4 disposed in a graphite crucible 3, which is supported by a crucible receiver 23 attached to a pedestal 19 with the quartz crucible 4 melting the starting material and holds the molten material liquid as such.

The pulling unit 300 immerses a seed crystal 14 in the molten material liquid and then pulls up it at a predetermined rate to grow a single crystal 6.

In this device, the isolating plate 8 is disposed to completely isolate from each other the gaseous phase portions in the single crystal producing unit and the starting material feeding mechanism, and the guide cylinder inserted airtightly into the isolating plate is positioned at its tip in the molten material liquid. The resistor heater covered with the protective cylinder is disposed in the guide cylinder. The material rod is melted while its droplets are falling. Therefore, possible falling foreign matters are prevented from arrival at the crystal growing region and vibrations of the surface of the molten material liquid due to the feeding of the starting material are suppressed.

The vibrations themselves stay within the protective cylinder and do not propagate to an overall surface of the molten material liquid.

A quantity of impurities entering from the crucible material into the crystal material is reduced and high speed growth of the crystal is achieved compared to the double crucible.

Since the resistor heater is used as a heater for melting the starting material rod, the occurrence of electric discharge in the single crystal producing device is prevented. In addition, since the resistor heater employs a double-spiral structure, the device is compact, and the tip of the heater can be set at the highest temperature, so that the melted portion of the material can be accessed to the surface of the molten material liquid, the material is melted immediately above the molten material liquid and ingress of impurities into the melted material is greatly reduced.

Since the protective cylinder and the resistor heater taper downward, control of a fed quantity of material is easily achieved.

Since the protective cylinder is provided within the pulling unit except in a region where a single crystal is grown, it will not hinder the pulling operation.

By the above-described effects, in the present invention, feeding of the material which is the largest problem with the continuous charge type semiconductor single crystal producing device is achieved without adversely affecting the crystal under growth. As a result, the concentration of dopants in the molten material liquid in the crucible is controllable and the axial resistivity of the single crystal is maintained constant.

A method of growing a silicon single crystal using the single crystal producing device of FIG. 8 will be described below.

First, evacuation is made separately through the discharge ports o1 and o2 such that the molten material liquid 100 and the upper material feeding unit are $10^{-2}$–$10^{-3}$ and $10^{-3}$–$10^{-4}$ Torr, respectively.

Then, the heater 1 is turned on to heat the quartz crucible 3 to obtain a molten material liquid, and the resistor heater 11 is also turned on so as to provide a predetermined temperature profile. A polycrystalline silicon rod (having the same concentration of impurities as the pulled single crystal) 13 is fed as a starting material rod by the material rod feed 20 at a predetermined rate into the resistor heater 11.

A seed crystal is immersed into the molten material liquid and pulled at a predetermined rate by the pulling unit 300 to grow the single crystal 6.

Figure 11:
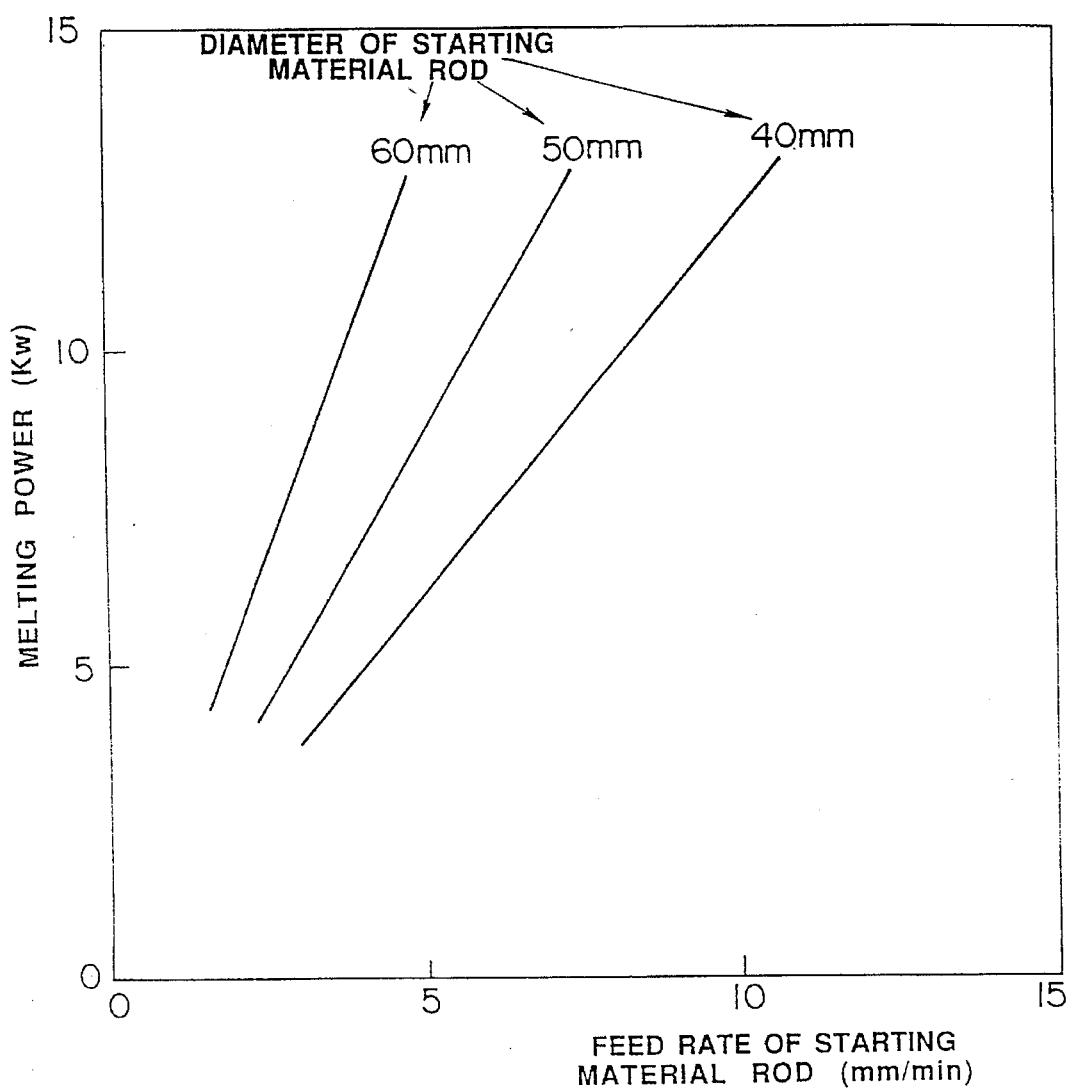
FIG. 11 shows the relationship between material feeding speed and melting electrical power with respect to starting material diameter.

The conditions for growing the single crystal were that the quartz crucible 4 had a diameter of 16 inches; the crucible 3 had a melted material of 15 kg; the material rod 13 had a diameter of 50 mm; the grown single crystal 6 had a diameter of 4 inches; the crystal resistivity (doped with phosphorus) was 15 cm; the pulling rate was 1 mm/min. The relationship between the feeding rate of the material rod and the power of the resistor heater, shown in FIG. 11, was maintained. The feeding rate of the material rod 13 was 4 mm/min. and the power of the resistor heater 11 was 6 kW. The relationship between a change in the weight of the pulled single crystal and the feeding rate of the material rod was beforehand measured and a constant feeding rate obtained from the result of the measurement was used.

Figure 12:
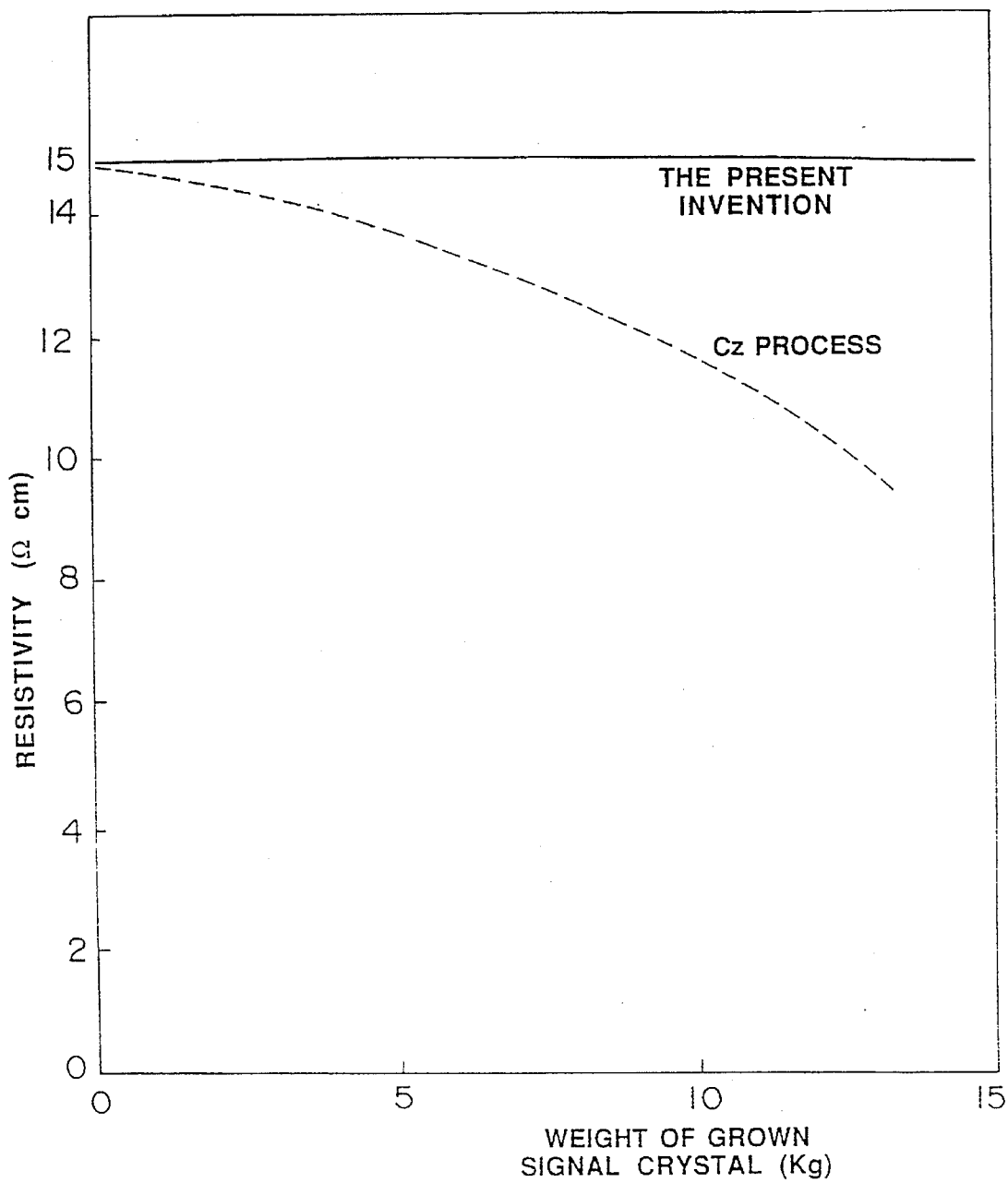
FIG. 12 shows the relationship between starting weight and resistivity of a grown single crystal in the third embodiment of the present invention.

FIG. 12 shows an axial change in the resistivity of the single crystal thus obtained. For reference, it also shows the result of using an ordinary CZ process with the same initial quantity of melted material as that in the inventive method. In the ordinary CZ process, as the crystal grows more, its resistivity changes more greatly while the single crystal grown by the inventive process exhibits a substantially constant resistivity.

Figure 13:
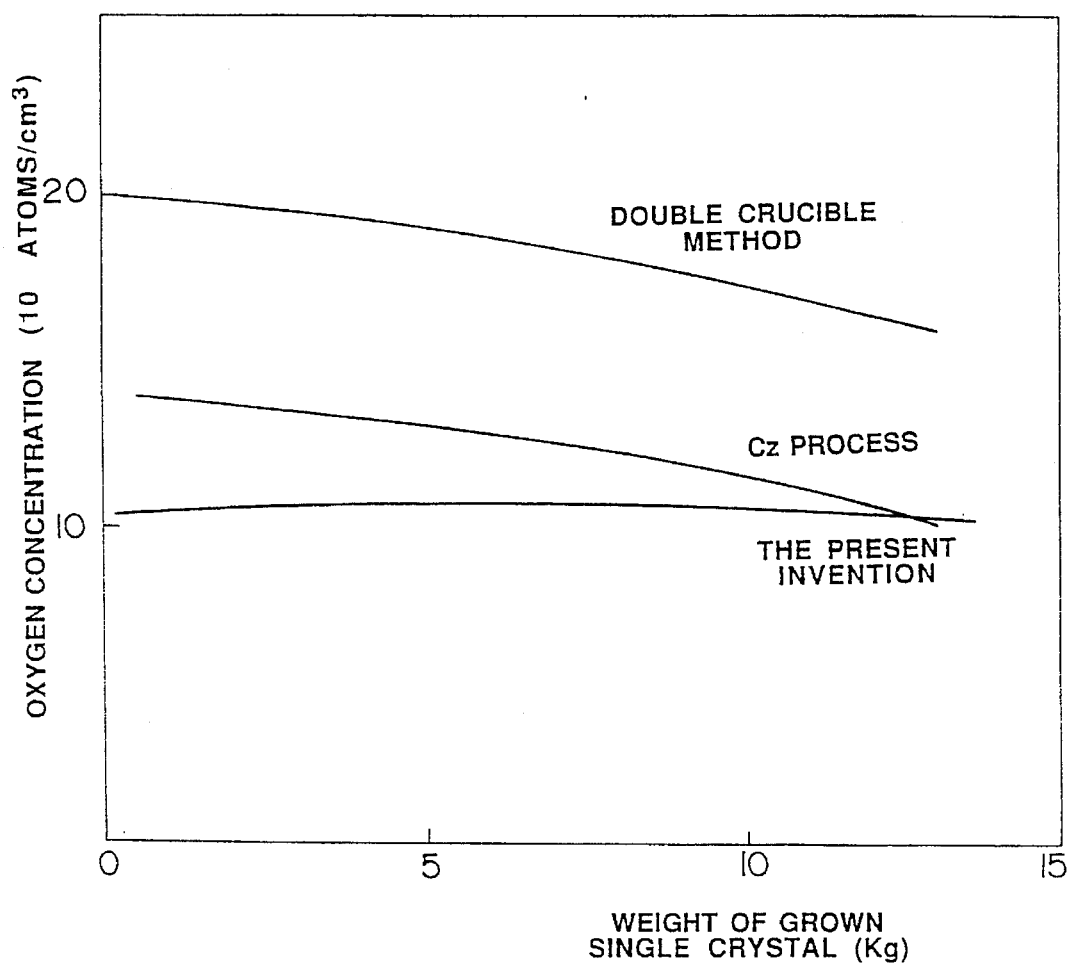
FIG. 13 shows the relationship between weight and oxygen concentration of a grown single crystal in the third embodiment of the present invention.

FIG. 13 shows an axial change in the oxygen concentration. The growth conditions are the same. As will be obvious from FIG. 13, the single crystal grown according to the present invention is axially uniform in concentration, and is low in oxygen concentration compared to that obtained by the ordinary CZ process, and less than ⅔ of the oxygen concentration of the crystal obtained by the double-crucible. Thus, the range of oxygen controlled can be extended.

While in the inventive device, quartz or carbon is preferable as the material of the protective cylinder, the tip of the protective cylinder which touches the molten material liquid is preferably made of quartz of high purity. The material of the resistor heater may be that of an ordinary carbon heater. The material of the temperature keeping cylinder may be carbon or silicon carbide.

While in the embodiment the feeding rate of the starting material rod is illustrated as a predetermined constant one, it may be sequentially adjusted while a change in the weight of the pulled single crystal is being measured.

Alternatively, the level of the surface of the molten material liquid within the crucible 4 may be sensed, for example, by a photosensor, and the fed quantity of material may be changed in accordance with a change in the level of the molten material liquid such that the level of the molten material liquid is invariably maintained constant.

While in the embodiment the protective cylinder and the resistor heater are illustrated as tapering downward, the aforementioned effects are achieved even by causing only the resistor heater to taper downward. The protective cylinder preferably tapers downward from a standpoint of thermal efficiency.

The present invention is not limited to the present embodiment and is applicable to various applications, for example, the growth of single crystals other than silicon crystals, application of a magnetic field, the use of a granular material, etc.

EXAMPLE 4

Figure 14:
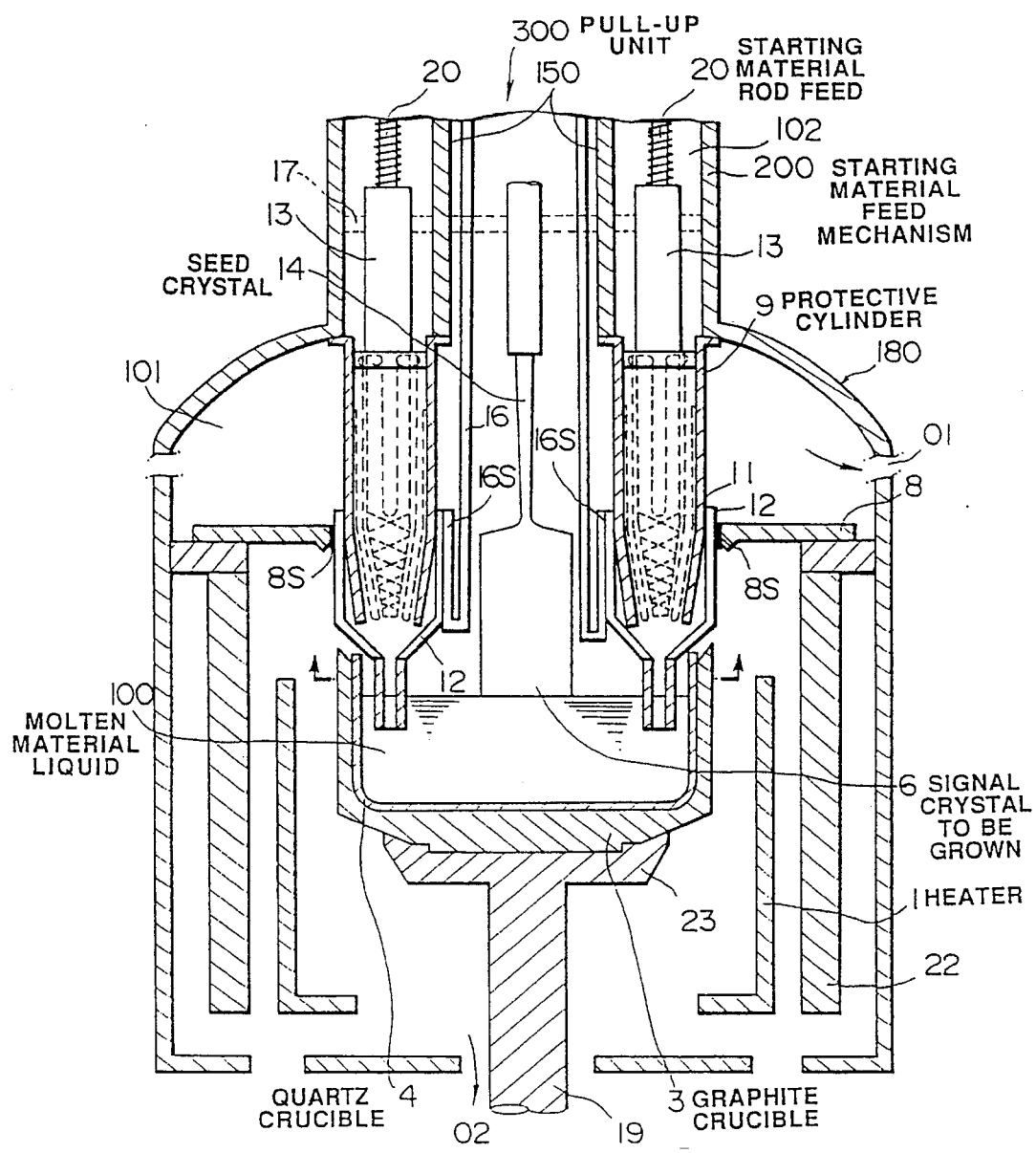
FIG. 14 is a longitudinal cross-section view of a single crystal producing device according to the fourth embodiment of the present invention.

Referring to FIG. 14, a fourth embodiment of the present invention will be described below.

The same reference numeral is used to denote the same element in the fourth and first embodiments and further duplicate description thereof will be omitted.

The device is different from the embodiment 3 of the present invention of FIG. 8 only in that an outer cylinder 16 of the pulling unit 300 has a folded portion 16s so as to have a double structure of a U-shaped cross section in the vicinity of the molten material liquid 100, the folded portion being inserted and supported airtightly in a hole in an isolating plate 8. This serves to prevent the pulling unit from receiving a possible thermal influence from a high temperature end of the starting material feeding unit.

INDUSTRIAL APPLICABILITY

According to the present invention, a single crystal with an impurity concentration being substantially uniform in the longitudinal direction can be grown continuously. The present invention is applicable to applications, for example, the growth of a single crystal made of a material other than silicon, application of a magnetic field, the use of a granular material, etc.

We claim:

1. A method of producing a semiconductor single crystal, comprising:

a semiconductor single crystal growing step of immersing a seed crystal into a molten material liquid contained in a crucible and for gradually pulling up the seed crustal to grow a single crystal; and a starting material feeding step of melting a starting material rod by heating in a gaseous phase space maintained to be independent of a pulling gaseous phase portion where the pulled single crystal is present and feeding a new material in a melted state into the crucible;

wherein the semiconductor single crystal growing step is performed simultaneously with the starting material feeding step so that the pulling of the single crystal is continuously performed.

2. A method according to claim (1), wherein the starting material feeding step preforms feeding of a starting material together with an inert gas of 50 cc/min.cm$^2$ or more.

* * * * *